United States Patent [19]
Miwa

[11] Patent Number: 5,677,883
[45] Date of Patent: Oct. 14, 1997

[54] SEMICONDUCTOR ASSOCIATIVE MEMORY DEVICE WITH ADDRESS CORRECTOR FOR GENERATING FORMAL ADDRESS SIGNAL REPRESENTATIVE OF ONE OF REGULAR MEMORY WORDS PARTIALLY REPLACED WITH REDUNDANT MEMORY WORD

[75] Inventor: Tohru Miwa, Tokyo, Japan

[73] Assignee: NEC Corporation, Tokyo, Japan

[21] Appl. No.: 704,982

[22] Filed: Aug. 29, 1996

[30] Foreign Application Priority Data

Sep. 7, 1995 [JP] Japan .................. 7-255544

[51] Int. Cl.$^6$ .................................. G11C 29/00
[52] U.S. Cl. .................. 365/200; 365/189.07
[58] Field of Search .................. 365/200, 230.06, 365/189.07, 230.03, 49

[56] References Cited

U.S. PATENT DOCUMENTS

| | | | |
|---|---|---|---|
| 5,319,589 | 6/1994 | Yamagata | 365/49 |
| 5,528,540 | 6/1996 | Shibata | 365/200 |

FOREIGN PATENT DOCUMENTS

| | | |
|---|---|---|
| 3-276495 | 12/1991 | Japan . |
| 4-079099 | 3/1992 | Japan . |

*Primary Examiner*—David C. Nelms
*Assistant Examiner*—Jon Mai
*Attorney, Agent, or Firm*—Foley & Lardner

[57] ABSTRACT

A semiconductor associative memory device directly supplies status signals each representative of matching state or mismatching state from regular/redundant memory words to an address generator for generating a preliminary address signal representative of the regular/redundant memory word supplying the status signal representative of the matching state, and an address correcting system examines the preliminary address signal to see whether or not the preliminary address signal is representative of one of the regular/redundant memory word affected by a replacement of a defective regular memory word with the redundant memory word; when the preliminary address signal is representative of the regular/redundant memory word, the address correcting system generates a formal address signal representative of the address of one of the regular memory words expected to store the data code matched with a given data code if all the regular memory words are excellent at storing data codes.

9 Claims, 3 Drawing Sheets

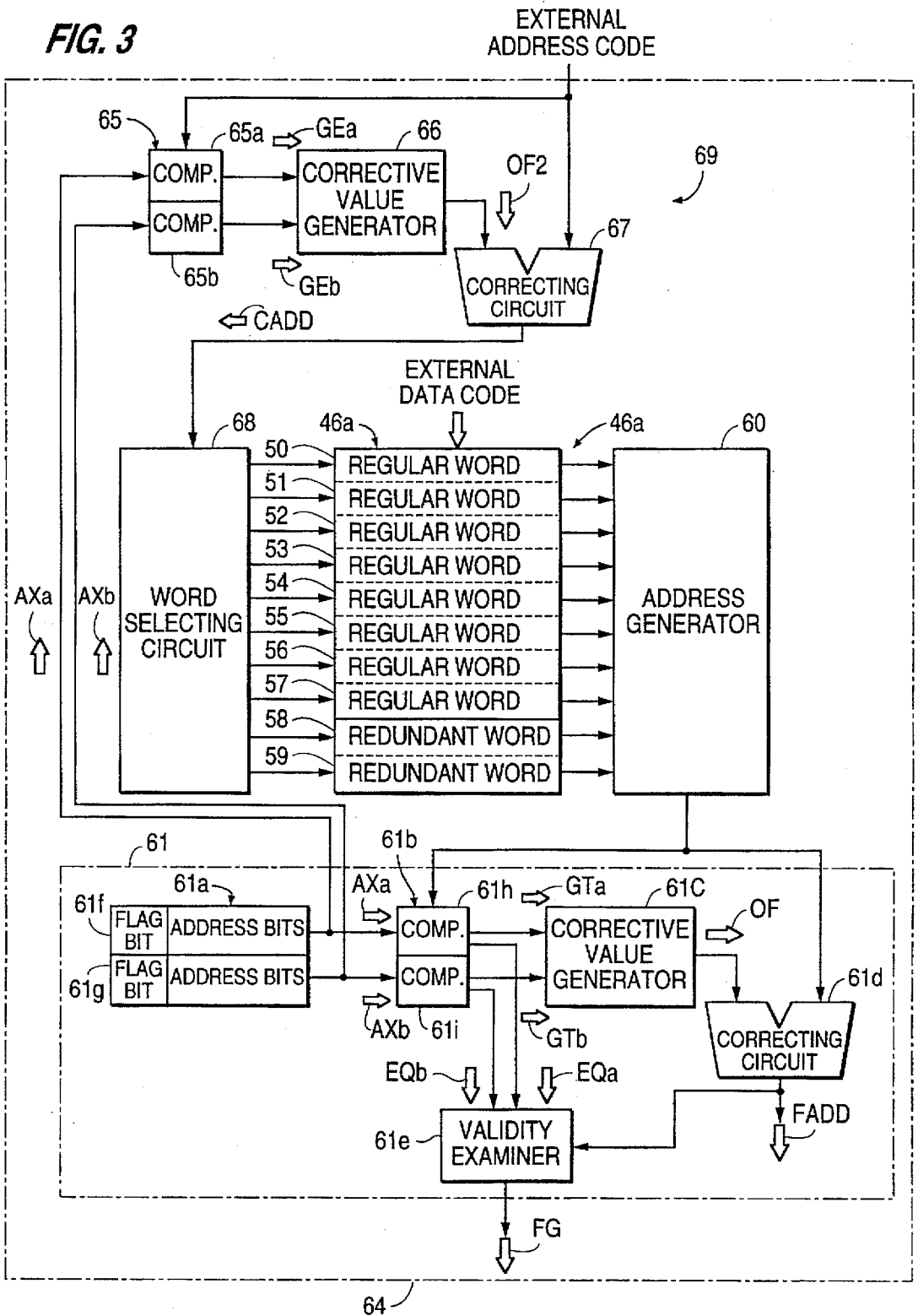

SEMICONDUCTOR ASSOCIATIVE MEMORY DEVICE WITH ADDRESS CORRECTOR FOR GENERATING FORMAL ADDRESS SIGNAL REPRESENTATIVE OF ONE OF REGULAR MEMORY WORDS PARTIALLY REPLACED WITH REDUNDANT MEMORY WORD

FIELD OF THE INVENTION

This invention relates to a semiconductor associative memory device and, more particularly, to a semiconductor associative memory device having redundant memory words.

DESCRIPTION OF THE RELATED ART

Various kinds of semiconductor memory device are known. One aspect for classifying the semiconductor memory devices is how a memory location is selected from the memory array.

The first kind of semiconductor memory devices assign addresses to the memory locations, and an address signal selects one of the memory locations so as to read or write data information. Typical examples of the first kind of semiconductor memory devices are known as a semiconductor read-only memory device and a semiconductor random access memory device.

The second kind of semiconductor memory devices is a content addressable, and is called as "semiconductor associative memory device". The second kind of semiconductor memory device stores pieces of data information at memory locations, respectively, and selects one of the memory locations storing a piece of data information matched with a piece of data information supplied from the outside thereof so as to generate an address signal.

The redundant technology is popular in the first kind of semiconductor memory devices, and surely improves the production yield. Research and development efforts have been made on the redundant technology applicable to the second kind of semiconductor devices. The redundant technology for the semiconductor associative memory device is expected to maintain the relative relation among memory locations after a replacement of a defective memory location with a redundant memory location.

A typical example of the semiconductor associative memory device with redundant memory words is disclosed in Japanese Patent Publication of Unexamined Application No. 4-79099. FIG. 1 illustrates the prior art semiconductor associative memory device disclosed in the Japanese patent Publication of Unexamined Application.

The prior art semiconductor associative memory device includes m regular memory words $10, 11, 12, 13, 1j, 1k, 1l$ and $1m$ and a redundant memory words $20$ and $2a$. These regular/redundant memory words $10$-$1m$ and $20$-$2a$ are capable of storing data words, respectively, and each of the regular memory words $10$-$13$ is replaceable with the redundant memory word $20$. Each of the regular memory words $1j$-$1m$ is also replaceable with the redundant memory word $2a$. The four regular memory words $10$-$13$ or $1j$-$1m$ and one redundant memory word $20$ or $2a$ form a memory unit $25$ or $26$.

The prior art semiconductor associative memory device further includes (m+a) memory circuits $30$ to $3o$ respectively associated with the regular/redundant memory words $10$-$1m$ and $20$-$2a$, and the memory circuits $30$-$3o$ store controlling data bits representative of whether the associated regular/redundant memory words are excellent at storing data words or defective.

The prior art semiconductor associative memory device further includes connectors $40$ and $41$ and an address generator $43$. The connector $40$ is connected to the regular/redundant memory words $10$-$13$ and $20$ and the memory circuits $30$-$34$, and is responsive to the controlling data bits for selecting excellent four regular/redundant memory words from the five regular/redundant memory words. If the regular memory word $10$ is defective and, accordingly, replaced with the redundant memory word $20$, the connector $40$ connects the regular/redundant memory words $11$-$13$ and $20$ to the address generator $43$. Similarly, the connector $41$ is connected to the regular/redundant memory words $1j$-$1m$ and $2a$ and the memory circuits $3k$-$3o$, and is responsive to the controlling data bits so as to also select excellent four regular/redundant memory words from the five regular/redundant memory words.

The address generator $43$ has four input nodes connected to the connector $40/41$, and results of information retrieval are supplied to the address generator $43$. The address generator $43$ processes the results on information retrieval, and selects one of the four regular/redundant memory words so as to generate an address.

The prior art semiconductor associative memory device encounters the following problems. First, the redundant memory words $20$-$2a$ insufficiently rescue the memory units $25$ and $26$, and the improvement of production yield is not so high as expected. Most of the defective regular memory words are due to a particle adhered to the semiconductor wafer during the fabrication process, and a large particle makes a plurality of regular memory words concurrently defective. Even if each memory unit $25$ or $26$ includes more than one redundant memory word, the redundant memory words merely rescue the memory unit when the defective regular memory words are not greater than the redundant memory words.

Another problem is a trade-off between the occupation area assigned to each regular/redundant memory word and the associated memory circuit and a repetition of data loading. In detail, the prior art semiconductor associative memory device requires the memory circuits $30$-$3o$ so as to store the controlling data bits for the regular/redundant memory words $10$-$1m$ and $20$-$2a$, respectively. When the memory circuits $30$-$3o$ are implemented by a non-volatile memory, each regular/redundant memory word and the memory circuit occupy a wide area, because the non-volatile memory cell usually requires a large amount of real estate. The non-volatile memory is not appropriate for a large scale integration. On the other hand, if a volatile memory forms the memory circuits $30$-$3o$, the occupation area is reduced; however, the memory circuits $30$-$3o$ lose the controlling data bits after a power-off, and it is necessary to rewrite the controlling data bits into the memory circuits $30$-$3o$ at every power-on.

SUMMARY OF THE INVENTION

It is therefore an important object of the present invention to provide a semiconductor associative memory device which is improved in production yield and appropriate for a large scale integration without a complicated data restoring.

To accomplish the object, the present invention proposes to restore a formal address from a preliminary address when a defective regular memory section is replaced with a redundant memory section.

In accordance with the present invention, there is provided a semiconductor associative memory device comprising: a plurality of regular memory sections respectively storing data codes, and comparing the data codes with a given data code so as to generate status signals each representative of matching state or mismatching state; at least one redundant memory section replaceable with one of the plurality of regular memory sections so as to store one of the data codes, and comparing the aforesaid one of the data codes with the given data code so as to generate one of the status signals; a first address generator connected to the plurality of memory sections and the aforesaid at least one redundant memory section, and responsive to the status signals for generating a preliminary address signal representative of one of the plurality of regular memory sections or the at least one redundant memory section supplying the status signal representative of the matching state; and an address correcting system connected to the address generator, and storing an address assigned to the aforesaid one of the plurality of regular memory sections replaced with the at least one redundant memory section so as to generate a formal address signal when the preliminary address signal is representative of the aforesaid at least one redundant memory section or one of the plurality of regular memory sections affected by a replacement of the aforesaid one of the plurality of regular memory sections with the at least one redundant memory section, the formal address signal being representative of a formal address of one of the plurality of regular memory sections which is expected to store the aforesaid one of the data codes matched with the given data code if the plurality of regular memory sections are excellent at storing the data codes.

BRIEF DESCRIPTION OF THE DRAWINGS

The features and advantages of the semiconductor associative memory device according to the present invention will be more clearly understood from the following description taken in conjunction with the accompanying drawings in which:

FIG. 3 is a block diagram showing the arrangement of another semiconductor associative memory device according to the present invention.

DESCRIPTION OF THE PREFERRED EMBODIMENTS

First Embodiment

Figure 1:
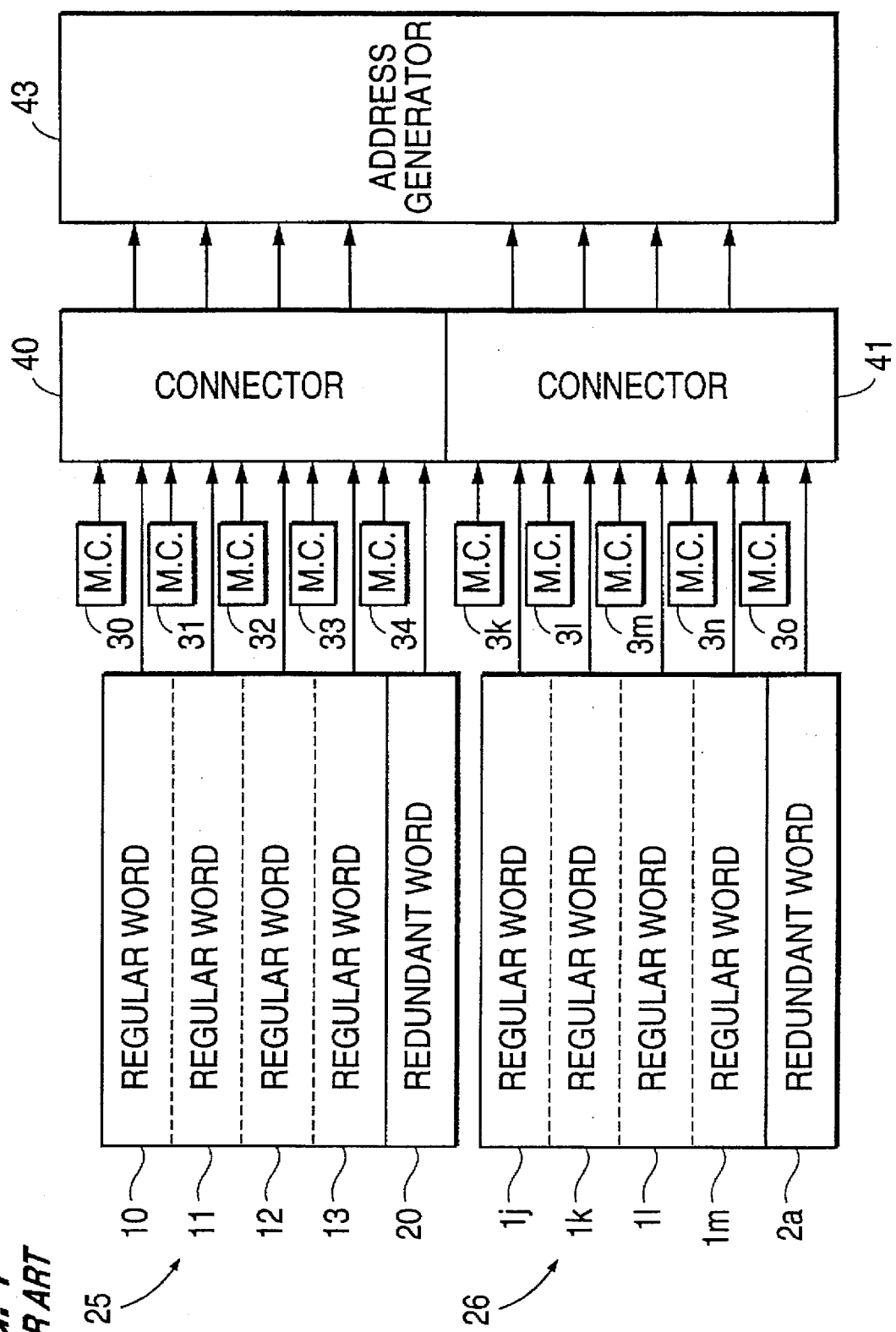
FIG. 1 is a block diagram showing the prior art semiconductor associative memory device.
Figure 2:
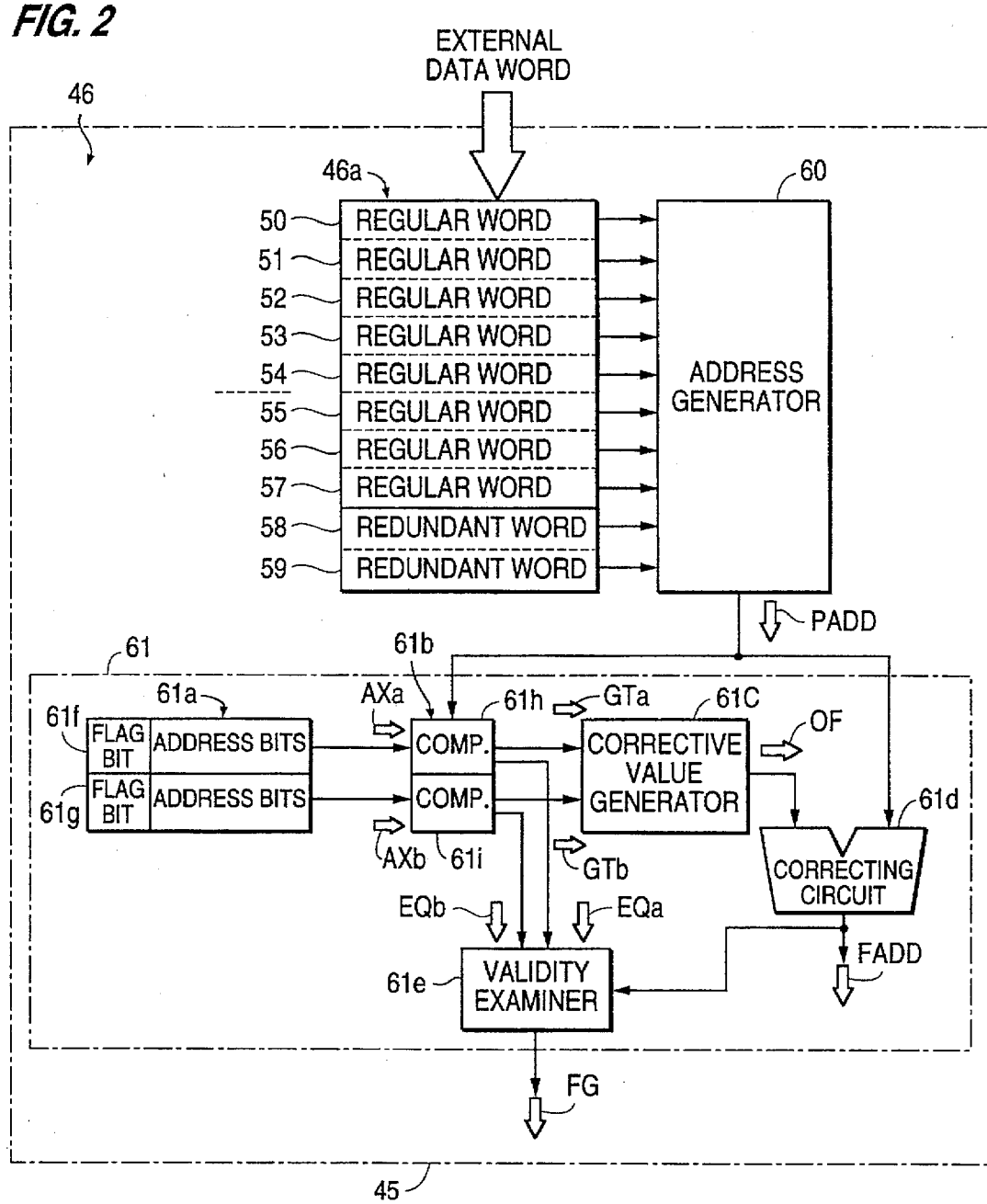
FIG. 2 is a block diagram showing the arrangement of a semiconductor associative memory device according to the present invention.

Referring to FIG. 2 of the drawings, a semiconductor associative memory device embodying the present invention is fabricated on a semiconductor chip 45. The semiconductor associative memory device comprises a plurality of memory unit 46, and only one memory unit 46a is shown in FIG. 2. All of the memory units 46 are similar in configuration to one another, and description is only made on the memory unit 46a for the sake of simplicity.

The memory unit 46a includes eight regular memory words 50 to 57 and two redundant memory words 58 and 59. The regular/redundant memory words can store data words, respectively, and the regular memory words 50-57 are selectively replaced with the redundant memory words 58 and 59 as described hereinlater.

An external data word is supplied to the memory unit 46a, and is compared with the data words stored in the regular/ redundant memory words 50-59 in parallel. The regular/ redundant memory words 50-59 generate status signals each representative of matching state or mismatching state between the external data word and the stored data word.

The memory unit 46a is accompanied with an address generator 60, and the regular/redundant memory words 50-59 are directly connected to the address generator 60. The regular/redundant memory words 50 to 59 are directly connected to the address generator 60. The address generator 60 selects one of the regular/redundant memory words 50-59 on the basis of the status signals, and generates a preliminary address signal PADD representative of a preliminary address assigned to the selected regular/ redundant memory word. The regular memory words 50 to 58 and the redundant memory words 58 and 59 are assumed to be assigned the preliminary addresses "0" to "7" and "8" to "9" In this instance, a memory word with a smaller preliminary address is located at a higher position than a memory word with a larger preliminary address. For example, the regular memory word 57 is located at the higher position rather than the redundant memory words 58 and 59. However, the preliminary addresses are assigned for the sake of description, and do not limit the technical scope of the present invention.

If one of the regular memory words such as the regular memory word 52 is defective, the defective regular memory word 52 is replaced with the redundant memory word 58, and the other redundant memory word 59 is not used for a data storage. Therefore, the regular/redundant words 50-51 and 53-58 are available for the data storage, and the regular-redundant memory words 53 to 58 serve as the regular memory words 52 to 57, respectively.

On the other hand, if two defective regular memory words such as the regular memory words 51 and 53 are found to be defective, the defective regular memory words 51 and 53 are replaced with the redundant memory words 58 and 59, and the regular/redundant memory words 50, 52 and 54-59 are used as the data storage. The regular/redundant memory words 52 and 54-59 serve as the regular memory words 51 to 57, respectively. Thus, the redundant memory word at a higher position has the priority in the replacement of defective regular memory word.

The address generator 60 is accompanied with an address correcting system 61, and the preliminary address signal PADD is supplied to the address correcting system 61 so as to generate a formal address signal FADD and a flag signal FG representative of the invalidity of the formal address signal FADD.

The address correcting system 61 includes a memory circuit 61a, a comparator 61b, a corrective value generator 61c, an address correcting circuit 61d and a validity examiner 61e. These component units 61a to 61e cooperates with each other, and responsive to the preliminary address signal PADD for generating the formal address signal FADD and the flag signal FG. The formal address signal FADD is representative of the address assigned to one of the regular memory words 50 to 57 which is expected to store a data code matched with the external data code if all the regular memory words 50 to 57 are excellent at storing data codes.

In detail, the memory circuit 61a contains two memory units 61f and 61g, and the two memory units 61f and 61g are respectively associated with the two redundant memory words 58 and 59. The memory unit 61f stores a flag bit representative of a replacement with a defective regular memory word and address bits representative of the address assigned to the defective regular memory word. The flag bit and the address bits are coded into a first defective address code AXa. Similarly, the memory unit 61g stores a flag bit representative of a replacement with another defective regular memory word and address bits representative of the address assigned to the defective regular memory word. The flag bit and the address bits are also coded into a second defective address code AXb. The memory circuit 61a supplies the first and second defective address codes AXa and AXb to the comparator 61b.

The comparator 61b has two sub-comparators 61h and 61i, and the sub-comparators 61h and 61i respectively compare the first address represented by the address bits of the first defective address code AXa and the second address represented by the address bits of the second defective address code AXb with the preliminary address. When the preliminary address is greater than the first address or the second address in the presence of the flag bit, the sub-comparator 61h or 61i changes an instruction signal GTa or GTb representative of the necessity of the address correction to an active level, and supplies it to the corrective value generator 61c. If the preliminary address is greater than both of the first and second addresses, both sub-decoders 61h and 61i change the instruction signals GTa and GTb to the active level.

On the other hand, when the preliminary address is matched with the first address or the second address in the presence of the flag bit, the sub-comparator 61h or 61i changes a matching signal EQa or EQb representative of the address assigned to the defective regular memory word to an active level, and supplies it to the validity examiner 61e.

However, if the preliminary address is less than the first and second addresses, the sub-comparators 61h and 61i maintain the instruction signals GTa and GTb and the matching signals EQa and EAb in an inactive level.

The corrective value generator 61c is responsive to the instruction signals GTa and/or GTb for supplying a correction signal OF representative of a corrective value. The correction signal OF is supplied to the correcting circuit 61d. The corrective value generator 61c determines the corrective value as follows.

If both instruction signals GTa and GTb are in the active level, the corrective value generator 61c decides the corrective value to be "−2", because two defective regular memory words increase the addresses greater than the address of the second defective regular memory word by "2".

When one of the instruction signal GTa or GTb is in the active level, the corrective value generator 61c decides the corrective value to be "−1", because the first defective regular memory word increases the addresses by one.

When both instruction signals GTa and GTb are in the inactive level, the corrective value generator 61c sets the corrective value to zero, because the defective regular memory word or words do not affect the address of the regular memory word less than that of the first defective regular memory word.

If the memory sub-circuits 61f and 61g are assigned to a defective memory word with a relatively small address and a defective memory word with a relatively large address, the corrective value generator 61c can determine a memory word represented by the preliminary address to be whether or not the memory word is located at a position higher than the positions of the defective regular memory words by comparing the address of the defective regular memory words at the highest position with the preliminary address, and the logic function of the corrective value generator 61c becomes simpler.

In this instance, the address correcting circuit 61d is implemented by an adder, and carries out an addition between the corrective value and the preliminary address. The sum of the corrective value and the preliminary address is represented by a formal address signal FADD, and is output from the address correcting circuit 61d.

The validity examiner 61e is responsive to the matching signal EQa or EQb for generating the flag signal FG representative of the invalidity of the formal address signal FADD. After the correction, the formal address signal FADD is representative of one of the addresses assigned to the regular memory words 50 to 57. However, if the formal address signal FADD represents an address out of the address range between the regular memory words 50 to 57, the formal address signal FADD is indicative of an invalid address, and the validity generator 61e changes the flag signal FG to the active level.

When the matching signal EQa or EQb is in the active level, the preliminary address signal designates the defective memory word, and the data code stored in the defective regular memory word is not reliable. For this reason, the validity examiner 61e changes the flag signal FG to the active level. However, if the formal address signal FADD indicates one of the regular memory word in the absence of the matching signals EQa and EQb, the validity examiner 61e maintains the flag signal FG in the inactive level.

As will be understood from the foregoing description, the semiconductor associative memory device according to the present invention only requires the memory sub-circuits 61f and 61g equal to the redundant memory words. Even if the memory sub-circuits 61f/61g are implemented by a non-volatile memory, the memory circuit 61a occupies a small amount of real estate, and is not an obstacle of a large scale integration. This means the manufacturer can increase the redundant memory words. The non-volatile memory does not require a data rewrite, and the semiconductor associative memory device is free from the complicate data loading.

Second Embodiment

Turning to FIG. 3 of the drawings, another semiconductor associative memory device embodying the present invention is fabricated on a semiconductor chip 64. The semiconductor associative memory shown in FIG. 3 is developed on the basis of the semiconductor associative memory device shown in FIG. 2. Memory words, an address generator, an address correcting system and circuits of the second embodiment are labeled with the same references as those of the first embodiment corresponding thereto without detailed description.

Newly added features of the second embodiment are a second comparator 65, a second corrective value generator 66, a second address correcting circuit 67 and a word selecting circuit 68. The memory sub-circuit 61f stores the address of a defective regular memory word higher than the address of another defective regular memory word.

The comparator 65 includes two sub-comparators 65a and 65b, and the sub-comparators 65a and 65b compare the first and second addresses with an external address code representative of an address of one of the regular memory words 50 to 57. When the address of the external address code is equal to or less than the first address AXa stored in the memory sub-circuit 61f in the presence of the flag bit, the sub-comparator 65a changes an instruction signal GEa to an active level. If the address of the external address code is equal to or less than the address prior to the second address AXb, i.e., (AXb−1) in the presence of the flag bits, the sub-comparator 65b changes an instruction signal GEb to the active level.

The corrective value generator 66 is responsive to the instruction signal or signals GEa/GEb so as to generate a second correction signal OF2 representative of a corrective value. When both of the instruction signals GEa and GEb are in the active level, the corrective value generator 66 determines the corrective value to be "0". If only the instruction signal GEa is in the active level, the corrective value generator 66 sets the corrective value to "1". On the other hand, if both of the instruction signals GEa and GEb are in the inactive level, the corrective value generator 66 determines the corrective value to be "2".

The external address code and the correcting signal OF2 are supplied to the second address correcting circuit 67, and the second address correcting circuit 67 adds the corrective value to the address represented by the external address code. The address correcting circuit 67 generates a corrected address signal CADD representative of the corrected address, and the corrected address signal CADD is supplied to the word selecting circuit 68.

The word selecting circuit 68 is responsive to the corrected address signal CADD for selecting one of the regular/redundant memory words 50 to 59.

In this in stance, the second comparator 65, the second corrective value generator 66 and the second address correcting circuit 67 form in combination a second address correcting system 69.

The semiconductor associative memory device behaves as similar to the first embodiment, and the address correcting system 61 outputs the formal address signal FADD as if no regular memory word is replaced with the redundant memory word 58/59.

Moreover, the second comparator 65, the corrective value generator 66 and the address correcting circuit 67 cause the word selecting circuit 68 to exactly select a regular/redundant memory word assigned the address represented by the external address code.

In detail, when the external address code represents an address less than the addresses of all the defective regular memory words, the second corrective value generator 66 supplies the corrective value "0" to the second address correcting circuit 67, and the corrective address signal CADD represents the address identical with that of the external address code. The addresses of the excellent regular memory words higher than the highest defective memory word have not been changed, and, for this reason, the address represented by the external address signal is used as the address of the corrected address signal CADD.

When the address represented by the external address code is equal to or greater than the first address of the higher defective memory word, the second address correcting circuit 67 adds "one" to the address of the external address signal, and the word selecting circuit 68 selects the regular/redundant memory word next to the regular memory word represented by the external address code, because data words have been stored in the next regular/redundant memory words after the highest defective memory word.

When the address represented by the external address code is equal to or greater than the address of the regular memory word prior to the lower defective regular memory word, the second address correcting circuit 67 adds "two" to the address of the external address code, and the word selecting circuit 68 exactly selects the regular/redundant memory word which stores the data code to be stored in the lower defective regular memory word.

Thus, if the redundant memory word or words are used for data codes, the second address correcting system 69 staggers the address represented by the external address code, and allows an external device to exactly access the data code to be stored in the defective memory word.

Although particular embodiments of the present invention have been shown and described, it will be obvious to those skilled in the art that various changes and modifications may be made without departing from the spirit and scope of the present invention.

For example, each memory unit may include only one or more than two redundant memory words. If the memory unit includes only one redundant memory word, the corrective value generator supplies the corrective value of "0" or "1" to the address correcting circuit. On the other hand, if the memory unit includes n redundant memory words, the corrective value generator supplies the corrective value of "0", "1", . . . or "n" to the address correcting circuit.

In the first and second embodiments, the address is sequentially increased from the regular memory word farthest from the redundant memory words to the redundant memory word farthest from the regular memory words. However, the address may be sequentially decreased from the regular memory word farthest from the redundant memory words, or the addresses may be assigned to the regular/redundant memory words in accordance with another rule.

Yet another semiconductor associative memory device may have a switching circuit between an external data/address port and an address correcting circuit shared between the address correcting systems 61 and 69.

The semiconductor associative memory device may further comprise a memory array accessible with the formal address signal.

What is claimed is:

1. A semiconductor associative memory device comprising:

a plurality of regular memory sections respectively storing data codes, and comparing said data codes with a given data code so as to generate status signals each representative of matching state or mismatching state;

at least one redundant memory section replaceable with one of said plurality of regular memory sections so as to store one of said data codes, and comparing said one of said data codes with said given data code so as to generate one of said status signals;

an address generator connected to said plurality of memory sections and said at least one redundant memory section, and responsive to said status signals for generating a preliminary address signal representative of one of said plurality of regular memory sections or said at least one redundant memory section supplying the status signal representative of said matching state; and a first address correcting system connected to said address generator, and storing an address assigned to said one of said plurality of regular memory sections replaced with said at least one redundant memory section so as to generate a formal address signal when said preliminary address signal is representative of said at least one redundant memory section or one of said plurality of regular memory sections affected by a replacement of said one of said plurality of regular memory sections with said at least one redundant memory section, said formal address signal being representative of a formal address assigned to one of said plurality of regular memory sections which is expected to store said one of said data codes matched with said given data code if said plurality of regular memory sections are excellent at storing said data codes.

2. The semiconductor associative memory device as set forth in claim 1, in which said first address correcting system includes a memory circuit storing said address assigned to said one of said plurality of regular memory sections replaced with said at least one redundant memory section and generating a defective address signal representative of said address stored therein, a first comparator comparing said address represented by said defective address signal with an address represented by said preliminary address signal so as to generate a first controlling signal representative of said at least one redundant memory section or said one of said plurality of regular memory sections affected by said replacement of said one of said plurality of regular memory sections with said at least one redundant memory section, a first corrective value generator responsive to said first controlling signal for generating a first correcting signal representative of a first corrective value, and a first address correcting circuit carrying a calculation between said first corrective value and said address represented by said preliminary address signal so as to determine said formal address.

3. The semiconductor associative memory device as set forth in claim 2, in which said memory circuit further stores a flag bit representative of said replacement of said one of said plurality of regular memory sections with said at least one redundant memory section, and said flat bit causes said first comparator to compare said address represented by said defective address signal with said address represented by said preliminary address signal.

4. The semiconductor associative memory device as set forth in claim 2, in which said comparator further generates a second controlling signal when said address represented by said defective address signal is matched with said address represented by said preliminary address signal, and said first address correcting system further includes a validity examiner responsive to said formal address signal and said second controlling signal for generating a flag signal representative of invalidity of said formal address signal when said first comparator generates said second controlling signal or said formal address signal represents an address not assigned to said plurality of regular address sections.

5. The semiconductor associative memory device as set forth in claim 1, in which said plurality of regular memory sections are sequentially increased in address and said at least one redundant memory section is assigned the greatest address, and in which, when said one of said plurality of memory sections is replaced with said at least one redundant memory section, data codes to be stored in said one of said plurality of regular memory sections replaced with said at least one redundant memory section to the regular memory section prior to said at least one redundant memory section are respectively stored in the regular memory section next to said one of said plurality of regular memory sections replaced with said at least one redundant memory section to said at least one redundant memory section, respectively.

6. The semiconductor associative memory device as set forth in claim 5, in which said first address correcting system includes a memory circuit storing said address assigned to said one of said plurality of regular memory sections replaced with said at least one redundant memory section and generating a defective address signal representative of said address stored therein, a first comparator comparing said address represented by said defective address signal with an address represented by said preliminary address signal so as to generate a first controlling signal when said address represented by said preliminary address signal is greater than said address represented by said defective address signal, a first corrective value generator responsive to said first controlling signal for generating a first correcting signal representative of one, and a first address correcting circuit adding one to said address represented by said preliminary address signal so as to determine said formal address.

7. The semiconductor associative memory device as set forth in claim 6, in which said comparator further generates a second controlling signal when said address represented by said defective address signal is matched with said address represented by said preliminary address signal, and said first address correcting system further includes a validity examiner responsive to said formal address signal and said second controlling signal for generating a flag signal representative of invalidity of said formal address signal when said first comparator generates said second controlling signal or said formal address signal represents an address not assigned to said plurality of regular address sections.

8. The semiconductor associative memory device as set forth in claim 1, further comprising a second address correcting system connected to said first address correcting system for producing a corrected address signal from an external address signal, and a selecting circuit responsive to said corrected address signal for selecting one of said plurality of regular memory sections or said at least one redundant memory section, said second address correcting system changing an address represented by said external address signal for producing said corrected address signal when said address of said external address signal is representative of an address assigned to said one of said plurality of regular memory section affected by said replacement of said one of said plurality of regular memory sections with said at least one redundant memory section.

9. The semiconductor associative memory device as set forth in claim 8, wherein said first address correcting system includes a first comparator comparing said address of said defective address signal with an address of said preliminary address signal so as to generate a first controlling signal representative of said at least one redundant memory section or said one of said plurality of regular memory sections affected by said replacement of said one of said plurality of regular memory sections with said at least one redundant memory section, a first corrective value generator responsive to said first controlling signal for generating a first correcting signal representative of a first corrective value, and a first address correcting circuit carrying a calculation between said first corrective value and said address represented by said preliminary address signal so as to determine said formal address, and said second address correcting system includes a second comparator comparing said address of said defective address signal with said address of said external address signal so as to generate a second controlling signal representative of said at least one redundant memory section or said one of said plurality of regular memory sections affected by said replacement of said one of said plurality of regular memory sections with said at least one redundant memory section, a second corrective value generator responsive to said second controlling signal for generating a second correcting signal representative of a second corrective value, and a second address correcting circuit carrying a calculation between said second corrective value and said address represented by said external address signal so as to determine the address of said corrected address signal.

* * * * *